(12) United States Patent
Tokuda

(10) Patent No.: US 9,692,388 B2
(45) Date of Patent: Jun. 27, 2017

(54) HIGH FREQUENCY MODULE COMPRISING A BAND-PASS LC FILTER AND A PIEZOELECTRIC RESONATOR

(71) Applicant: MURATA MANUFACTURING CO., LTD., Kyoto-fu (JP)

(72) Inventor: Daisuke Tokuda, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 108 days.

(21) Appl. No.: 14/546,115

(22) Filed: Nov. 18, 2014

(65) Prior Publication Data

US 2015/0070107 A1 Mar. 12, 2015

Related U.S. Application Data

(63) Continuation of application No. PCT/JP2013/064344, filed on May 23, 2013.

(30) Foreign Application Priority Data

Jun. 1, 2012 (JP) ................................. 2012-125812

(51) Int. Cl.
*H03H 7/01* (2006.01)
*H03H 9/25* (2006.01)
(Continued)

(52) U.S. Cl.
CPC ........ *H03H 9/0547* (2013.01); *H03H 7/0115* (2013.01); *H03H 7/1708* (2013.01);
(Continued)

(58) Field of Classification Search
CPC .. H03H 7/0115; H03H 7/1708; H03H 7/1791; H03H 9/542; H03H 9/465;
(Continued)

(56) References Cited

U.S. PATENT DOCUMENTS 6,548,942 B1 * 4/2003 Panasik ................. H03H 9/175
310/313 B
6,768,396 B2 * 7/2004 Klee ........................ H03H 3/02
333/187

(Continued)

FOREIGN PATENT DOCUMENTS

DE 10 2004 045 179 * 3/2006
JP H04-284713 A 10/1992
(Continued)

OTHER PUBLICATIONS

English language machine translation of JP 2008-053912, published Mar. 6, 2008, 11 pages.*

(Continued)

*Primary Examiner* — Barbara Summons
(74) *Attorney, Agent, or Firm* — Studebaker & Brackett PC

(57) ABSTRACT

Provided is a high frequency module capable of reducing size and cost. A high frequency module includes an LC filter having an inductor formed through a thin film process and a capacitor also formed through a thin film process, and a piezoelectric resonator that is connected in series to the LC filter and serves as a trap filter having a resonant frequency at the outside of a passing band of the LC filter.

4 Claims, 4 Drawing Sheets

(51) Int. Cl.
*H03H 9/15* (2006.01)
*H03H 9/05* (2006.01)
*H03H 9/54* (2006.01)
*H03H 9/02* (2006.01)
*H03H 9/205* (2006.01)

(52) U.S. Cl.
CPC ........ *H03H 7/1791* (2013.01); *H03H 9/0222* (2013.01); *H03H 9/205* (2013.01); *H03H 9/25* (2013.01); *H03H 9/542* (2013.01)

(58) Field of Classification Search
CPC ...... H03H 9/6409; H03H 9/6423; H03H 9/25; H03H 9/205; H03H 9/0222; H03H 9/0547; H03H 9/0557
USPC .......................... 333/193, 187, 175, 176, 178
See application file for complete search history.

(56) References Cited

U.S. PATENT DOCUMENTS

| | | | |
|---|---|---|---|
| 7,546,091 B2 | 6/2009 | Murakami et al. | |
| 2009/0128260 A1* | 5/2009 | Block | H03H 9/6483 333/187 |
| 2010/0109801 A1* | 5/2010 | Inoue | H03H 9/547 333/133 |
| 2010/0127795 A1* | 5/2010 | Bauer | H03H 7/0123 333/134 |
| 2014/0035702 A1* | 2/2014 | Black | H03H 7/075 333/186 |

FOREIGN PATENT DOCUMENTS

| | | | |
|---|---|---|---|
| JP | 2002-223102 A | | 8/2002 |
| JP | 2003-051731 A | | 2/2003 |
| JP | 2003-198207 | * | 7/2003 |
| JP | 2008-053912 A | | 3/2008 |
| JP | 2011-041082 A | | 2/2011 |
| WO | 20051088833 A1 | | 9/2005 |
| WO | WO 2006/032366 | * | 3/2006 |

OTHER PUBLICATIONS

English language machine translation of JP 2003-198207, published Jul. 11, 2003, 6 pages.*
English language machine tranlsation of WO 2006/032366, published Mar. 30, 2006, 4 pages.*
International Search Report; PCT/JP2013/064344; Jul. 23, 2013.
Written Opinion of the International Searching Authority; PCT/JP2013/064344; Jul. 23, 2013.

* cited by examiner

HIGH FREQUENCY MODULE COMPRISING A BAND-PASS LC FILTER AND A PIEZOELECTRIC RESONATOR

CROSS REFERENCE TO RELATED APPLICATIONS

This application claims benefit of priority to Japanese Patent Application No. 2012-125812 filed Jun. 1, 2012, and to International Patent Application No. PCT/JP2013/064344 filed May 23, 2013.

TECHNICAL FIELD

The present technical field relates to high frequency modules in which trap filters are connected to band-pass filters.

BACKGROUND

Recently, in mobile communication apparatuses such as cellular phones and so on, a variety of filter circuits have been used in order to obtain desired frequency characteristics. Further, cellular phones are strongly required to be reduced in size. As such, various types of piezoelectric filters including surface acoustic wave filters are widely used as the components that configure the above-mentioned filter circuits. For example, Japanese Unexamined Patent Application Publication No. 2003-51731 cited below discloses a filter device that is configured with a surface acoustic wave filter.

With regard to this type of filter device, a method in which an LC chip is externally connected so as to widen a band width of a band-pass filter that is configured with a piezoelectric filter such as a surface acoustic wave filter or the like has been known.

SUMMARY

Technical Problem

However, a structure in which an LC chip is externally connected to a piezoelectric filter has a problem that the size of a filter device becomes larger and the cost thereof is increased.

It is an object of the present disclosure to provide high frequency modules capable of being reduced in size and cost.

Solution to Problem

A high frequency module according to an aspect of the present disclosure includes a band-pass LC filter and a piezoelectric resonator. The stated LC filter is a band-pass LC filter having an inductor formed through a thin film process and a capacitor also formed through a thin film process. The stated piezoelectric resonator is connected to the LC filter and has a resonant frequency or an anti-resonant frequency at the outside of a passing band of the LC filter.

In the high frequency module according to a specific aspect of the present disclosure, the piezoelectric resonator is integrated into the LC filter. Accordingly, the high frequency module can be further reduced in size and cost.

In the high frequency module according to another specific aspect of the present disclosure, the piezoelectric resonator is laminated on the LC filter. Accordingly, a mounting space of the high frequency module can be reduced.

In the high frequency module according to still another aspect of the present disclosure, the piezoelectric resonator is configured with a boundary acoustic wave element. In the case of the boundary acoustic wave element, different from a case of a surface acoustic wave element, a space configured not to impede vibration is unnecessary. In this case, frequency characteristics can be improved because tan δ of the piezoelectric material is small. In addition, reduction in size of the high frequency module can be effectively realized.

Advantageous Effects of Disclosure

According to the high frequency module of the present disclosure, the band-pass LC filter has an inductor and a capacitor each formed through a thin film process, whereby reduction in size can be realized. In addition, because the high frequency module has a configuration in which a piezoelectric resonator as a trap filter is connected to the band-pass LC filter, reduction in size and cost of the high frequency module can be realized.

DETAILED DESCRIPTION

Hereinafter, specific embodiments of the present disclosure are described with reference to the drawings, whereby the present disclosure will be clarified.

Figure 1:
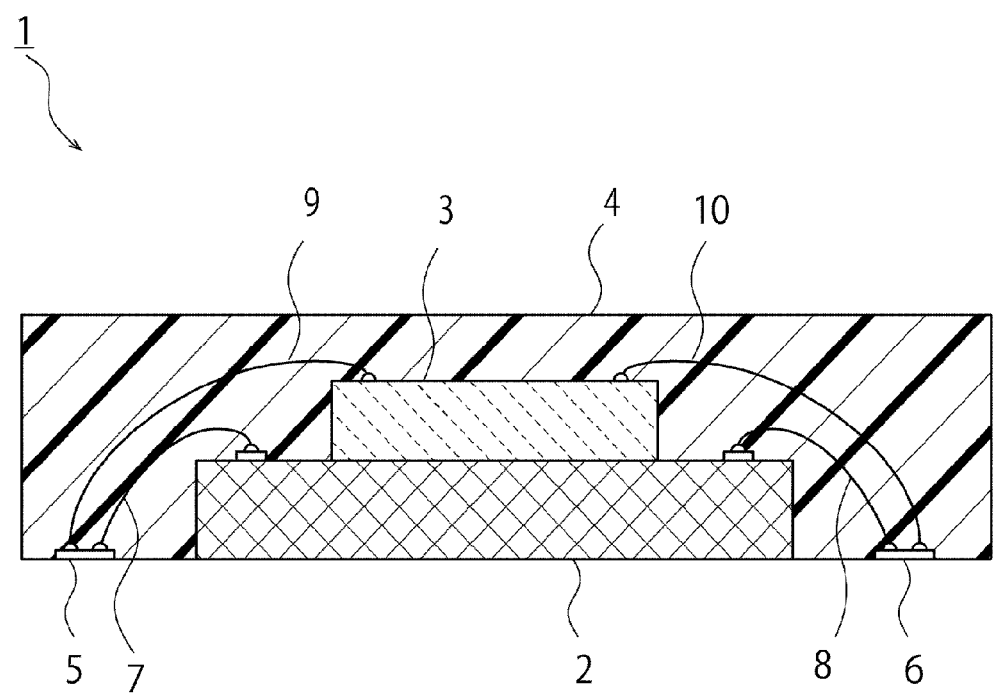
FIG. 1 is a schematic elevation cross-sectional view of a high frequency module according to an embodiment of the present disclosure.

FIG. 1 is a schematic elevation cross-sectional view of a high frequency module according to an embodiment of the present disclosure. A high frequency module 1 includes a band-pass LC filter 2. A piezoelectric resonator 3 is laminated on the LC filter 2. In the present embodiment, the piezoelectric resonator 3 is configured with a boundary acoustic wave element. Being laminated on the LC filter 2, the piezoelectric resonator 3 is integrated into the LC filter 2. A resin mold layer 4 is formed so as to cover side surfaces and an upper surface of the LC filter 2 as well as side surfaces and an upper surface of the piezoelectric resonator 3. The resin mold layer 4 is made of a synthetic resin.

On a lower surface of the resin mold layer 4, terminal electrodes 5 and 6 are formed to be used for electrical connection with the exterior. The terminal electrodes 5 and 6 are electrically connected with the LC filter 2 by bonding wires 7 and 8. The terminal electrodes 5 and 6 are further connected with the piezoelectric resonator 3 by bonding wires 9 and 10. With this, the piezoelectric resonator 3 is connected to the LC filter 2 in series as described later. A resonant frequency of the piezoelectric resonator 3 is set at a position where attenuation is intended to be made large. Accordingly, the resonant frequency of the piezoelectric resonator 3 is set at the outside of a passing band of the LC filter 2. Note that the piezoelectric resonator 3 may be connected in parallel.

The high frequency module 1 is characterized in that the LC filter 2 has an inductor formed through a thin film process and a capacitor also formed through a thin film process, and the piezoelectric resonator 3 has a resonant frequency or an anti-resonant frequency at the outside of the passing band of the LC filter 2.

Figure 2A:
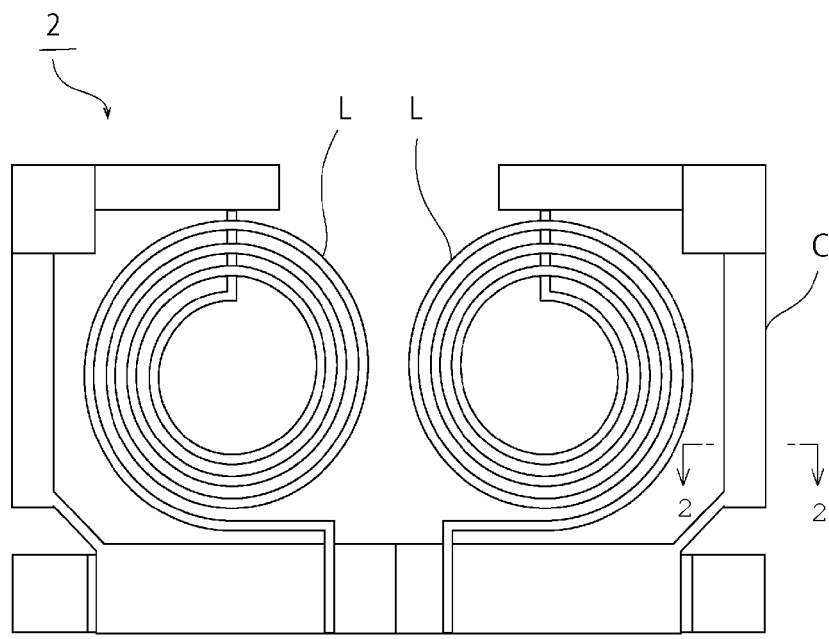
FIGS. 2(*a*) and 2(*b*) are a schematic plan view illustrating a principal portion of an LC filter of the high frequency module according to the embodiment of the present disclosure and a partially enlarged cross-sectional view of a portion taken along line 2-2 in FIG. 2(*a*), respectively.

FIG. 2(a) is a schematic plan view for explaining a portion which configures an inductor and a capacitor in the LC filter 2. The LC filter 2 is formed through a thin film process. In the LC filter 2, as illustrated in FIG. 2(a), an inductor L is configured by forming a coil pattern through a thin film process. In FIG. 2(a), a coil pattern that is formed across different layers in a multilayer body having been formed through a thin process is schematically illustrated.

Figure 2B:
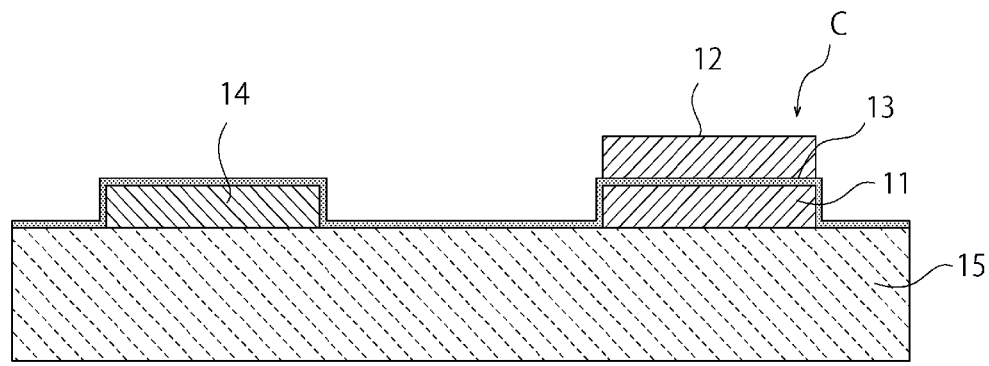

Likewise, in the LC filter 2, a capacitor C is formed through a thin film process. As illustrated in FIG. 2(b), at a portion where the capacitor C is formed, a first electrode 11 and a second electrode 12 is each formed through a thin film process overlap with each other with a dielectric film 13 formed through a thin film process interposed therebetween so that the capacitor C is configured.

Meanwhile, as illustrated in FIG. 2(b), the coil pattern configuring the inductor L is formed of a conductor 14 on the coil pattern. The dielectric film 13 is so formed as to cover the conductor 14 forming the coil pattern as well. The first electrode 11, the second electrode 12, and the conductor are each made of an appropriate metal or alloy. The dielectric film 13 is configured by forming an appropriate dielectric material through a thin film process. FIG. 2(b) is a partially enlarged cross-sectional view illustrating part of a portion that configures the capacitor C and the inductor L on an insulation layer 15. In reality, a plurality of insulation layers and a conductor formed among the plurality of insulation layers are provided under the insulation layer 15 so that the conductor 14 is extended while forming the coil pattern. As described earlier, the LC filter 2 is formed by the known thin film process. As the known thin film process, vapor deposition, sputtering, plating, or the like can be given.

Figure 6:
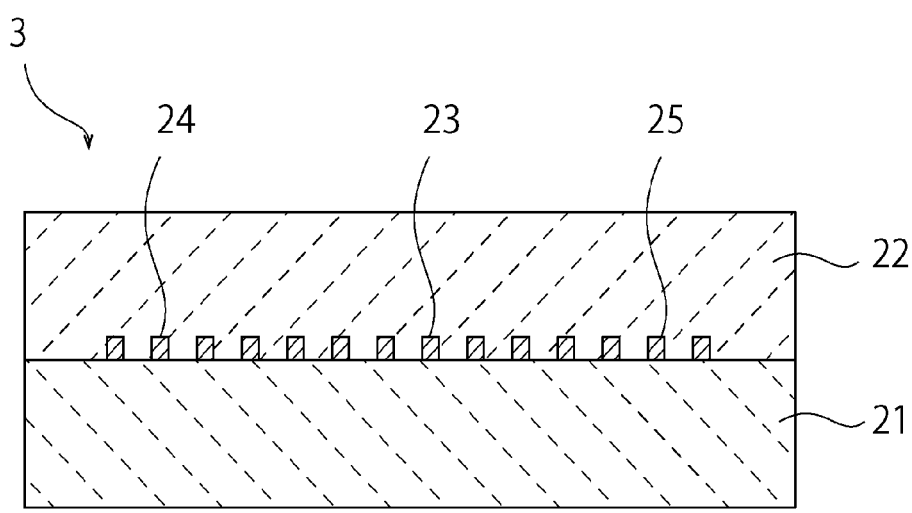
FIG. 6 is a schematic elevation cross-sectional view illustrating a boundary acoustic wave element as a piezoelectric resonator used in the present disclosure.

The structure of a boundary acoustic wave element used as the piezoelectric resonator 3 is not intended to be limited to any specific one. FIG. 6 is a schematic elevation cross-sectional view illustrating an example of a boundary acoustic wave element in the present embodiment. Here, a solid layer 22 for confining a boundary acoustic wave is laminated on a piezoelectric layer 21. The solid layer 22 is formed of a dielectric material such as $SiO_2$ or the like. An interdigital transducer (IDT) electrode 23 and reflectors 24, 25 are formed between the piezoelectric layer 21 and the solid layer 22.

In the case where the piezoelectric resonator 3 is configured with a boundary acoustic wave element, a space configured not to impede vibration is unnecessary. Therefore, lowering in profile and reduction in size of the high frequency module 1 shown in FIG. 1 can be further facilitated. Note that, however, in the high frequency module 1, because the piezoelectric element 3 is laminated on the LC filter 2 and integrated thereinto, even if the piezoelectric resonator other than a boundary acoustic wave element is used, reduction in size and cost can be realized.

In a case of a conventional structure in which an LC chip is externally connected to a piezoelectric filter, if a band-pass filter configured with a piezoelectric filter is a surface acoustic wave filter, its size is relatively large; and the size of the LC chip is also relatively large. This causes a filter device to be larger in size. In addition, the cost of the band-pass filter configured of the surface acoustic wave filter and so on is caused to be higher.

On the other hand, in the case of the high frequency module according to the present embodiment, the LC filter having an inductor and a capacitor each formed through the thin film process is used as a band-pass filter. Therefore, its size is extremely smaller than the size of a band-pass filter configured with a surface acoustic wave filter. With this small LC filter 2, a desired passing band can be ensured. Further, as for a portion where a large amount of attenuation is required, such a large amount of attenuation can be obtained as desired by using the piezoelectric resonator 3 as a trap filter. The piezoelectric resonator 3 used as such a trap filter can be small in size, which makes it possible to make the high frequency module 1 be reduced in size. As such, reduction in cost and size of the high frequency module 1 can be realized.

Figure 3:
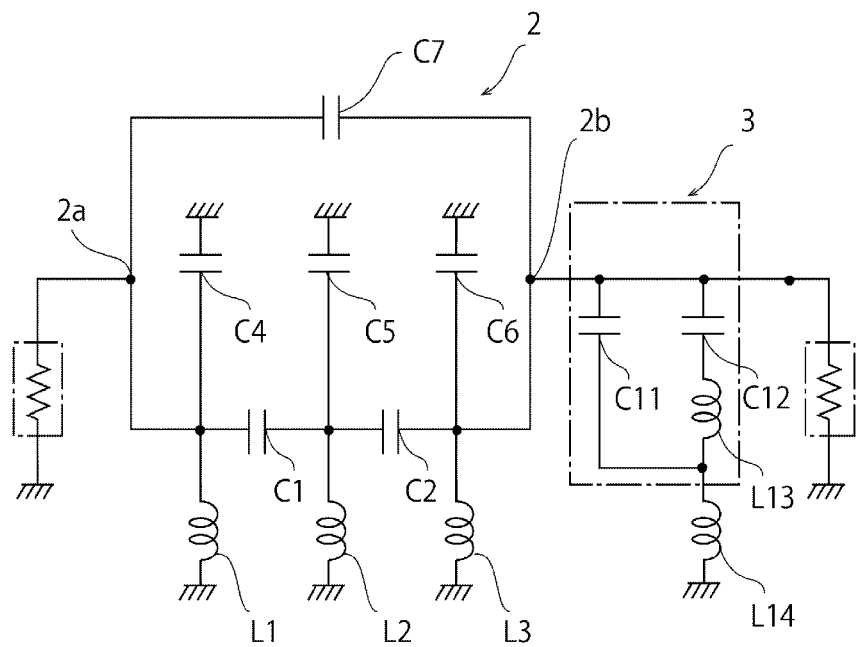
FIG. 3 is a diagram illustrating an equivalent circuit of the high frequency module according to the embodiment of the present disclosure.

FIG. 3 is a diagram illustrating an equivalent circuit of the high frequency module 1 according to the above-described embodiment. As shown in FIG. 3, the LC filter 2 includes an input terminal 2a and an output terminal 2b. A capacitor C1 and a capacitor C2 are provided in a serial arm connecting the input terminal 2a to the output terminal 2b. The capacitors C1 and C2 are connected in series. Inductors L1 through L3 are connected in parallel arms between the above serial arm and a ground potential, respectively. In other words, the inductor L1 is connected between the input terminal 2a and the ground potential; the inductor L2 is connected between a connecting point between the capacitors C1, C2 and the ground potential; and the inductor L3 is connected between the output terminal 2b and the ground potential.

Meanwhile, a capacitor C4 is connected between the input terminal 2a and the ground potential; a capacitor C5 is connected between the connecting point between the capacitors C1, C2 and the ground potential; and a capacitor C6 is connected between the output terminal 2b and the ground potential. Further, a capacitor C7 is connected in parallel to the serial arm between the input terminal 2a and the output terminal 2b. The LC filter 2 is configured in this manner.

Note that, however, in the present disclosure, the circuit configuration of the LC filter 2 is not intended to be limited to the configuration as shown in FIG. 3. In other words, in accordance with a desired passing band, an LC filter having a suitable configuration therefor can be used.

As shown in FIG. 3, the piezoelectric resonator 3 is connected in series to the LC filter 2. In the drawing, an equivalent circuit of the piezoelectric resonator 3 is illustrated. In this equivalent circuit, capacitors C11, C12 and inductors L13, L14 are connected between a serial arm in which a signal flows and a ground potential. More specifically, the capacitor C11 is connected in parallel to a serially wired portion of the capacitor C12 and the inductor L13. The inductor L14 represents an inductance component by wiring.

Note that the circuit of the piezoelectric resonator 3 is not intended to be limited to the configuration as shown in FIG. 3.

Figure 4:
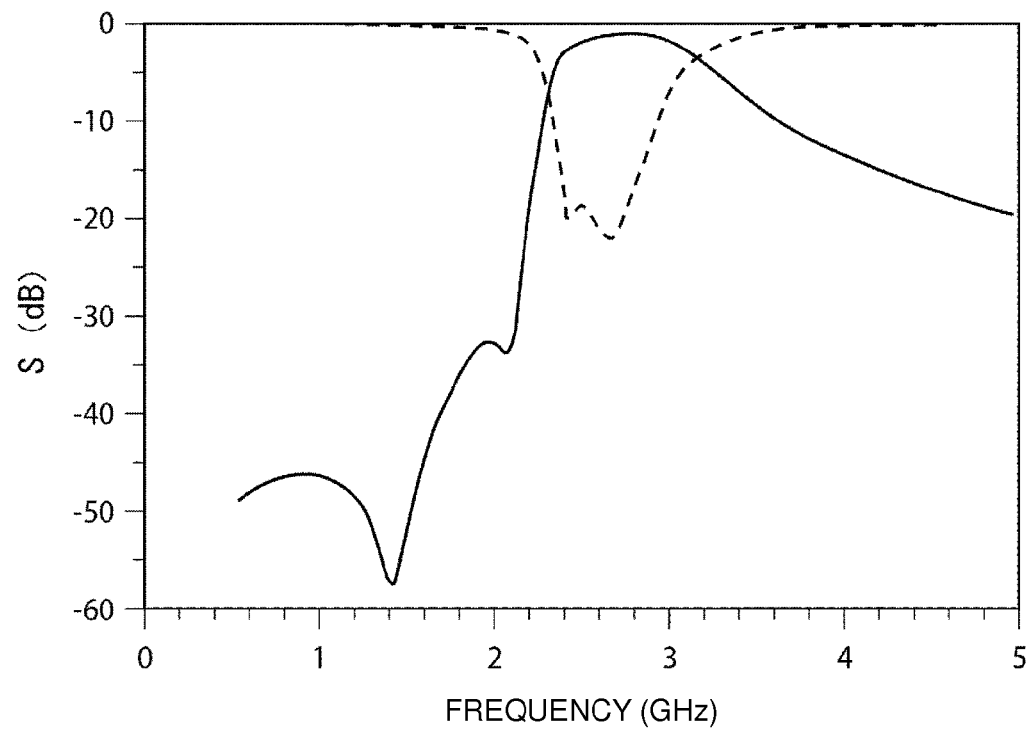
FIG. 4 is a diagram illustrating a transmission characteristic and a reflection characteristic of an LC filter.

FIG. 4 is a diagram illustrating a transmission characteristic and a reflection characteristic of the LC filter 2. A solid line indicates the transmission characteristic, while a broken line indicates the reflection characteristic.

Figure 5:
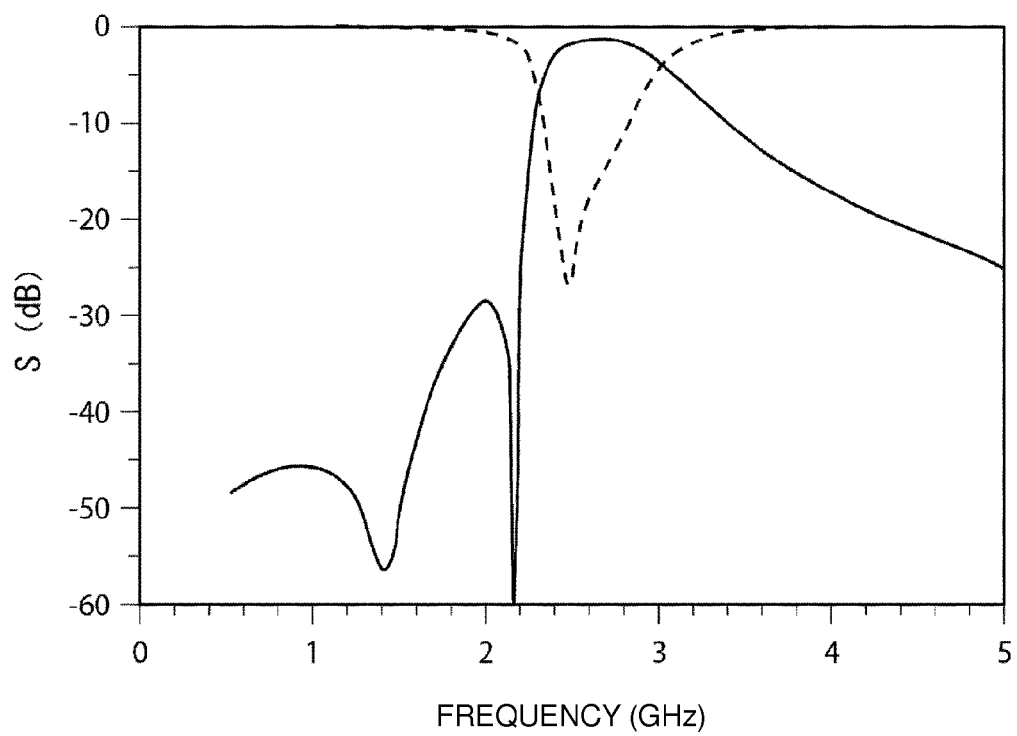
FIG. 5 is a diagram illustrating a transmission characteristic and a reflection characteristic of the high frequency module according to the embodiment of the present disclosure.

FIG. 5 is a diagram illustrating a transmission characteristic and a reflection characteristic of the high frequency module 1 of the present embodiment in which the piezoelectric resonator 3 is connected in series to the LC filter 2. A solid line indicates the transmission characteristic, while a broken line indicates the reflection characteristic.

Frequency characteristics indicated in FIGS. 4 and 5 are the characteristics when the LC filter 2 and the piezoelectric resonator 3 are configured in accordance with the following specifications: that is, C1=1.0 pF, C2=1.0 pF, C4=3.1 pF, C5=3.0 pF, C6=3.1 pF, C7=0.4 pF; L1=0.7 nH, L2=0.7 nH, L3=0.7 nH, C11=0.75 pF, C12=0.13 pF, L13=41 nH, L14=1 nH.

As can be understood from FIG. 4, the passing band of the LC filter 2 is a band from 2.4 to 3.0 GHz.

As can be understood by comparing FIG. 4 with FIG. 5, connecting the piezoelectric resonator 3 causes attenuation at the lower frequency side of the passing band, that is, in the vicinity of a frequency of 2.17 GHz, to be extremely large. In the present embodiment, the resonant frequency of the piezoelectric resonator 3 resides in the vicinity of 2.17 GHz. That is, a trap is formed in this portion so as to improve the frequency characteristics of the high frequency module 1. In a case where a piezoelectric resonator is connected in parallel to an LC filter, it is sufficient to set the anti-resonant frequency of the piezoelectric resonator at a band where the attenuation need be obtained.

In the above-described embodiment, the piezoelectric resonator 3 is laminated on and integrated into the LC filter 2. However, in the present disclosure, the piezoelectric resonator 3 is not necessarily needed to be laminated on the upper surface of the LC filter 2. The piezoelectric resonator 3 may be disposed on a side of the LC filter 2 and integrated thereinto by the resin mold layer 4. Also in this case, lowering in profile can be facilitated because the LC filter 2 is formed through the thin film process. In addition, cost reduction can be obtained like in the above-described embodiment. As such, reduction in cost and size can be realized.

Note that, however, it is preferable for the piezoelectric resonator 3 to be laminated on the LC filter 2 like in the above-described embodiment. The piezoelectric resonator 3 has a piezoelectric layer. The value of tan δ of this piezoelectric layer is extremely smaller than that of the resin mold layer 4. For example, in the case of the piezoelectric layer being LiNbO$_3$, tan δ is approximately 0.0006. On the other hand, in the case where the resin mold layer 4 is formed of a synthetic resin such as epoxy resin, for example, tan δ thereof is approximately 0.01. As such, since tan δ of the piezoelectric layer is extremely small, the frequency characteristics of the LC filter 2 can be improved if the piezoelectric resonator 3 is laminated on the LC filter 2. Accordingly, it is preferable that a boundary acoustic wave element be used as the piezoelectric resonator 3 and the piezoelectric resonator 3 be directly laminated on the LC filter 2 so that the boundary acoustic wave element and the piezoelectric layer are positioned immediately above the LC filter 2.

Note that, however, in the present disclosure, the piezoelectric resonator 3 is not intended to be limited to a boundary acoustic wave filter; the piezoelectric resonator 3 may be configured using another type of piezoelectric resonator. In this case, it is also preferable for the piezoelectric layer to be laminated on the LC filter because of the reason discussed above.

Since the piezoelectric resonator 3 is used as a trap filter as described before, it is smaller in size than the LC chip and can be configured at low cost. Accordingly, even in a case where a piezoelectric resonator other than a boundary acoustic wave element is used, reduction in size and cost of the high frequency module 1 can be realized.

Although the resin mold layer 4 is used in the above embodiment, the resin mold layer 4 may not be provided.

The invention claimed is:

1. A high frequency module comprising:
    a band-pass LC filter having an inductor formed through a thin film process and a capacitor also formed through a thin film process;
    a piezoelectric resonator that is connected to the LC filter and having a resonant frequency or an anti-resonant frequency at an outside of a passing band of the LC filter; and
    a resin mold layer formed so as to cover the periphery of the LC filter including upper and side surfaces thereof and the periphery of the piezoelectric resonator.

2. The high frequency module according claim 1, wherein the piezoelectric resonator is integrated into the LC filter.

3. The high frequency module according to claim 2, wherein the piezoelectric resonator is laminated on the LC filter.

4. The high frequency module according to claim 1, wherein the piezoelectric resonator is configured with a boundary acoustic wave element.

* * * * *